United States Patent
Brumley

[11] Patent Number: 5,904,560
[45] Date of Patent: May 18, 1999

[54] CLEANING STEP WHICH IMPROVES ELECTROMIGRATION PERFORMANCE OF INTERLAYER CONNECTION IN INTEGRATED CIRCUITS

[75] Inventor: Mark D. Brumley, Hillsboro, Oreg.

[73] Assignee: Intel Corporation, Santa Clara, Calif., CA

[21] Appl. No.: 08/623,672

[22] Filed: Mar. 29, 1996

[51] Int. Cl.$^6$ .................................................. H01L 21/28
[52] U.S. Cl. ............................ 438/639; 438/637; 134/2; 427/560
[58] Field of Search .................................. 438/637, 639; 134/2; 427/560

[56] References Cited

U.S. PATENT DOCUMENTS

| | | | |
|---|---|---|---|
| 4,242,698 | 12/1980 | Ghate et al. ............................... | 357/71 |
| 4,632,725 | 12/1986 | Hartmann et al. ....................... | 156/643 |
| 4,948,459 | 8/1990 | Van Laarhoven et al. .............. | 156/643 |
| 5,376,585 | 12/1994 | Lin et al. ................................. | 437/192 |
| 5,536,683 | 7/1996 | Lin et al. ................................. | 437/853 |

*Primary Examiner*—Margaret W. Glass
*Attorney, Agent, or Firm*—Blakely, Sokoloff, Taylor & Zafman

[57] ABSTRACT

An improved cleaning step for cleaning interconnects such as tungsten filed vias or contacts. After the tungsten plugs have been formed substantially coplanar with the surrounding dielectric surface (or adhesion or barrier layer surface), the wafers are cleaned in a sequence of chemicals that finishes in a solution that includes hydrogen peroxide. The temperature and concentrations of the active agents are chosen such that etching is minimized until the application of sonic energy. This light etching of the interconnect tungsten and cleaning of the exposed surface has been found to better prepare these surfaces for receiving an overlying metal layer. The electromigration performance of the overlying metal layer shows substantial improvement when this cleaning step is used. The cleaning step is used following an ethylene glycol-HF mixture cleaning step, dependent on the degree of interconnect and dielectric coplanarity after the tungsten etch step. The prior art step of argon sputtering is not needed to obtain the improved electromigration performance. Device yields may be substantially improved depending on the level of wafer cleanliness prior to the application of the clean.

3 Claims, 3 Drawing Sheets

CLEANING STEP WHICH IMPROVES ELECTROMIGRATION PERFORMANCE OF INTERLAYER CONNECTION IN INTEGRATED CIRCUITS

BACKGROUND OF THE INVENTION

1. Field of the Invention

The invention relates to the field of cleaning associated with metal interlayer connections, particularly plugs used in integrated circuits.

2. Prior Art

Integrated circuits have long used layers of metals for the upper levels of circuitry. These metal layers generally have interlayer connections (interconnects) and sometimes interconnects that allow direct connections to the lower levels of circuitry defined in the silicon substrate or polysilicon levels. Subsequent complexity has added more layers of metalization separated by dielectric layers, and has shrunk the size of the interlayer connections. These interlayer connections are often made with materials different from the primary metal of each layer. The openings in the dielectric layers are typically called contacts or vias, and the fill material is sometimes called a plug. These fill or plug materials are selected for their superior deposition properties in small geometries, in addition to their conductivity. As the physical dimensions of these interlayer connections have shrunk the reliability problems associated with electromigration have increased.

In typical processing for forming an interlayer connection, first an opening is patterned and etched through an interlayer dielectric. The dielectric may be doped glass such as boron-phosphorous glass (BPSG), spun glasses, or deposited or thermally grown oxides commonly referred to as an interlayer dielectric (ILD).

In some processes a thin adhesion layer is next required in preparation for the material used to fill the via or contact. A typical material is titanium nitride (TiN) which may be deposited by physical sputtering or a chemical vapor deposition (CVD) process. This adhesion layer covers the wafer surface and to various degrees the bottom and sidewalls of the contact or via.

The next step is the deposition of the interlayer connection (interconnect) material, which completely fills the openings as well as covering the surface of the dielectric layer or adhesion layer. A typical process deposits tungsten. This material is then partially removed by plasma etching or mechanical polishing until the surface film is removed and the remaining tungsten is somewhat coplanar with the opening in the dielectric. In this manner the interconnect between the layers of circuitry is defined and the wafer is ready for the next layer.

It is necessary to remove substantially all of the interconnect fill material from the surface of the dielectric prior to deposition of the next metal layer. For example, if tungsten is used as an interconnect material, any tungsten residue may create an electrical defect between the metal circuit lines of the overlying layer.

Moreover, the surface of the dielectric layer must typically be cleaned of residues remaining from the etch back or polish process again to prevent pattern disruption in the next metal circuit layer.

Finally, the surface of the interconnect filled via must be prepared for forming a low resistance interface for connection to the next metal layer. This is frequently done in the metal deposition machine using such techniques as argon sputtering. However, this process creates problems of its own as particles from the sputtering apparatus become deposited on the wafer, again creating pattern defects.

In typically processing in preparation for metal deposition of the filled interconnects, combinations of solvents and acids are used to clean the residues and prepare an interface for good conduction. However, this processing typically results in the formation of voids in the metal-interconnect interface as shown in FIG. 5. Additionally, sharp features of the interconnect material can create electric field nonuniformities that are undesirable.

The present invention provides a novel cleaning step for the interlayer connections that addresses these issues and, in fact, can be used to reduce the argon sputtering requirements.

SUMMARY OF THE INVENTION

In the fabrication of an interlayer connection (interconnect) such as a tungsten interconnect, a method for cleaning the surface which includes at least one exposed surface of the tungsten is described. The exposed surface is subjected to a solution that includes an active agent that etches tungsten. After removal of the solution from the surface of the layer, other processing can take place such as the deposition of a metal layer with or without additional cleaning such as argon sputtering. In one embodiment the solution comprises a temperature controlled solution of hydrogen peroxide coupled with the use of sonic energy.

Other aspects of the present invention will become apparent from the following detailed description of the invention.

DETAILED DESCRIPTION OF THE PRESENT INVENTION

A process is described particularly useful for cleaning a surface after a first metal layer such as a tungsten layer has been etched back to form interlayer connections (interconnects). In the following description, numerous specific details are set forth such as specific concentration levels, to provide a thorough understanding of the present invention. It will be apparent to one skilled in the art that the present invention may be practiced without these specific details. In other instances well-known processing steps have not been described in detail in order not to unnecessarily obscure the present invention.

DETAILED BACKGROUND USEFUL FOR UNDERSTANDING THE PRESENT INVENTION

Figure 1:
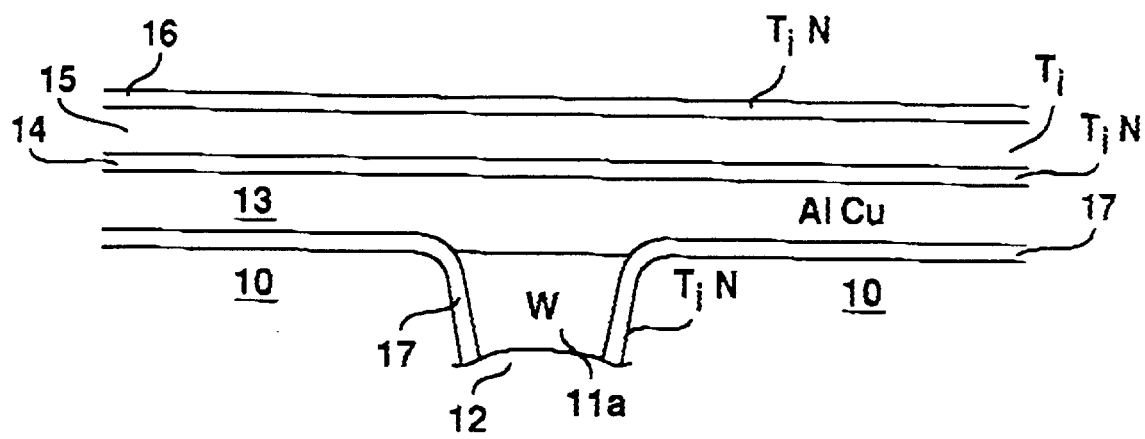
FIG. 1 is a cross sectional elevation view of a portion of a semiconductor integrated circuit with a highly planarized dielectric surface and showing an interconnect with an overlying metal line formed from a metal stack.

In FIG. 1 an interconnect 11a, also sometimes referred to below as a plug, is shown which provides a conductive path between a region 12 and an overlying metal line 13. The interconnect 11 a is disposed through an opening or via in a dielectric layer 10 which may be an ILD formed from the chemical vapor deposition (CVD) of SiO2, from silicon nitride, from a glass layer such as the BPSG previously mentioned or from other dielectric material. In the example of FIG. 1, a highly planarized dielectric layer 10 is shown with the metal line 13 formed over a thin adhesion layer 17 of TiN, comprises approximately 4,000Å of AlCu having 0.5% copper. An overlying barrier layer 14 of TiN, 300–400Å thick, is used between the AlCu and shunting layer 15 of titanium approximately 1,000Å thick. This metal stack is capped with an anti-reflective coating, specifically a TiN layer 16 approximately 350Å thick.

Figure 2A:
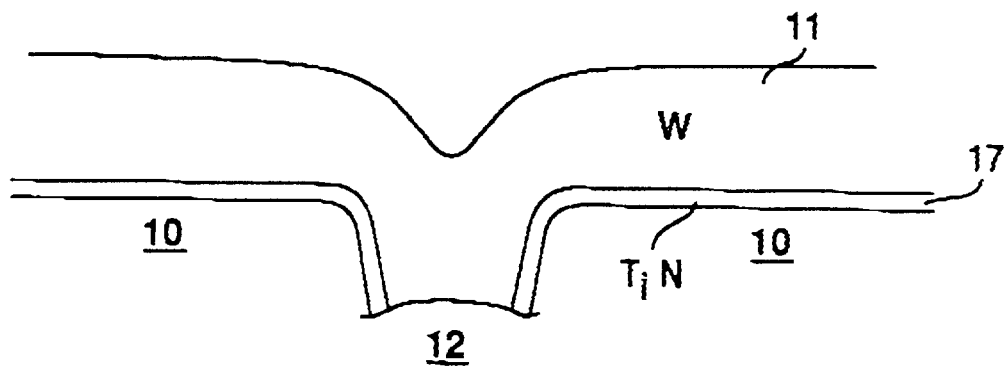
FIG. 2A is a cross sectional elevation view showing the interconnect of FIG. 1 before it is etched back to become substantially coplanar.
Figure 2B:
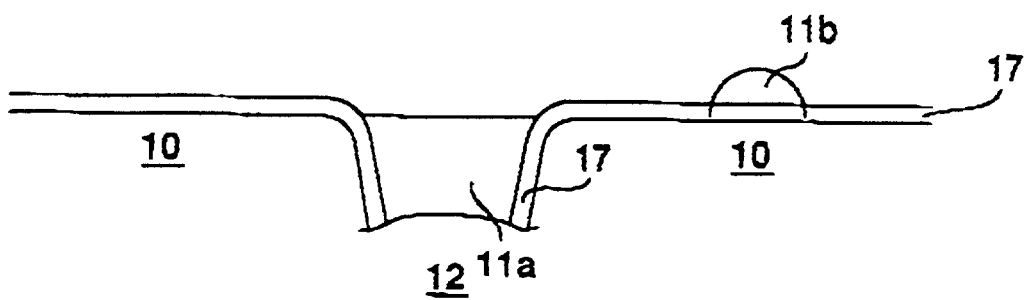
FIG. 2B shows the interconnect of FIG. 1 after it has been etched back to become substantially coplanar and additionally this figure shows an undesirable residue of tungsten which has remained on the dielectric layer.

In the formation of the interlayer interconnect 11a, an opening is formed through the dielectric layer 10 using well-known masking and etching techniques. A TiN layer which forms an adhesion layer 17 is deposited on the dielectric layer 10 and in the opening. Following this, a metal layer which in one embodiment is tungsten is formed over the TiN layer 17 as shown in FIG. 2.

Figure 3:
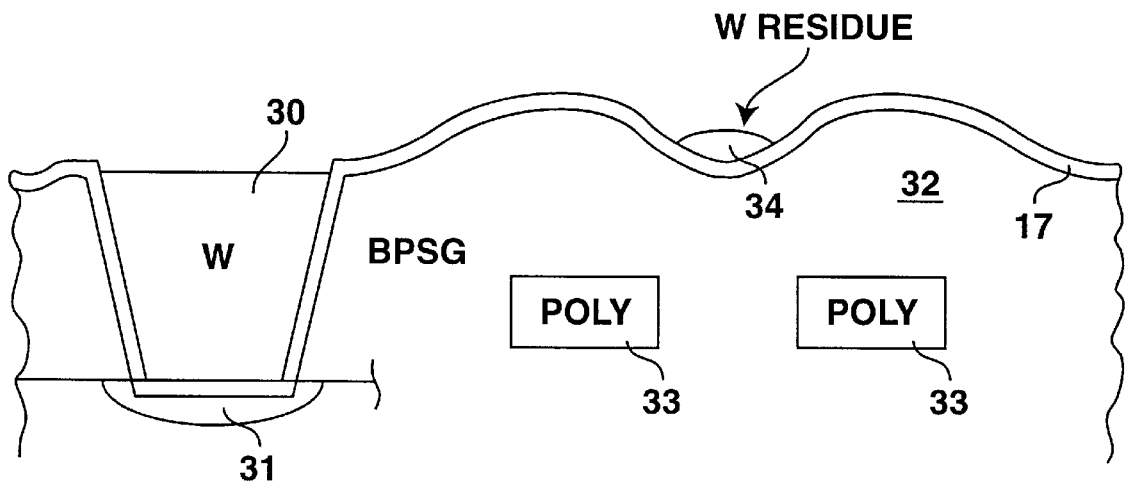
FIG. 3 is a cross sectional elevation view of a typical unplanarized BPSG layer showing an interconnect.

Next the tungsten layer 11 is etched back until it is substantially coplanar with the dielectric layer 10 as shown in FIG. 3. This leaves the interconnect 11a and the adhesion layer 17 disposed within the opening in layer 10. In one embodiment the TiN layer 17 remains on the surface of the dielectric layer 10. Any one of a plurality of well-known etching or other planarization steps may be used to remove the tungsten to define the plugs. The plugs may be coplanar, recessed or protruding.

The typical etchants used to etch the tungsten does not completely etch away all the tungsten from layer 17, rather it leaves tungsten residue shown as residue 11b. Such residue is undesirable because it can cause shorts between metal lines when they are subsequently formed.

The residue is more of a problem as shown in FIG. 3 where the dielectric layer such as the boron-phosphorous glass (BPSG) layer is not fully planarized. As shown in FIG. 3 the layer 32 includes irregularities caused by the underlying polysilicon members 33. The resultant valleys collect the residue tungsten 34. This residue can cause shorting between metal lines formed on layer 32. This shorting, by way of example, can cause an undesirable electrical path between the region 31 and a metal line adjacent to a line in contact with plug 30. The present invention is particularly useful in cleaning a dielectric surface such as shown in FIG. 3.

The source of the residual tungsten shown in FIGS. 1 and 3 can vary. Generally the residue is caused by: a) topographical irregularity where the tungsten was conformally deposited too thick for the film etchback process to remove; b) tungsten deposition decoration of underlying defects forming unusually thick layer of tungsten too thick to be removed by the standard process with anisotropic tungsten etching processes; c) irregularities in the intrinsic etch rate of the tungsten due to grain orientation effects interacting with the characteristics of the etch process and/or d) incorrect endpointing of the etchback process. An advantage of the present invention is that it applies an isotropic tungsten removal process and is not sensitive to the same tungsten crystal orientation problems as plasma or mechanical processes.

In the typical prior art processing the upper surface of the layer 17 is first cleaned in an ethylene glycol and HF cleaning step (referred to as "EG-3") which will be described later. (The residue 11b is not removed during this cleaning.) Following this, in the prior art, the surface is subjected to an argon sputter to prepare the upper surface of the layer 17 and the exposed surface of the tungsten interconnect 11a for the subsequently formed metal layer such as the AlCu layer 13 shown in FIG. 1.

The interface between the tungsten and the AlCu or other metal provides a source of defects that can lead to poor electromigration performance. These occur in the form of voids, residues, and trace amounts of fluorine or chlorine or other species from the tungsten removal process that can subsequently react with the metal at the interconnect interface. They do not necessarily occur directly at the interface at the time of deposition as the device will provide temperature and voltage driving forces to move defects to the interface. Another pertinent feature of the formation of the interconnect is the step coverage of the metal as it passes over the lip of the dielectric to the plug.

Figure 5:
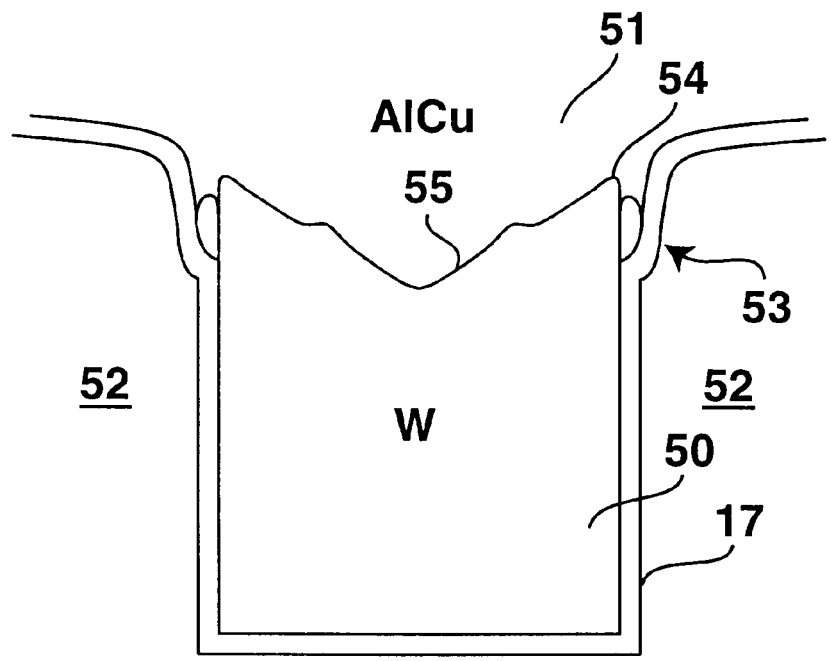
FIG. 5 is a cross sectional elevation view of an interconnect when processed in accordance with prior art cleaning steps.

Referring to FIG. 5, an interconnect 50 is shown which was formed from a first metal layer in a manner described in conjunction with FIGS. 1–3. When using the prior art cleaning steps that included the EG-3 and argon sputter steps discussed above on the exposed surface of the dielectric layer 52 (or on an adhesion layer formed on layer 52) prior to formation of the AlCu line 51, pockets are sometimes formed alongside the interconnect 20. These pockets are not always filled by the subsequent formation of the AlCu layer 51. This results in a void 53 shown in FIG. 5. Voids such as this can be the source of deteriorated performance in the metal line 51 resulting from electromigration. Additionally, with the prior art cleaning step somewhat sharp contours 54 result; this causes higher electric fields and deteriorated performance in the line 51. Also the upper surface 55 of the interconnect 50 when viewed in a scanning electron microscope shows a somewhat distressed surface which is not an ideal contact surface.

An additional benefit of the invention is the removal of surface contamination atoms from the tungsten. With the present invention the elements of fluorine, chlorine and sulfur were observed to be removed below detection levels by the present invention. At the same time the physical structure of the interconnect surface and composition is being modified, the present invention substantially removes particle debris from the rest of the dielectric surface as well as etching tungsten residues.

OVERVIEW OF THE CLEANING OF THE PRESENT INVENTION

With the present invention, following etch back of the first metal layer such as the tungsten layer 11 of FIG. 2A, again the EG-3 step is used. The undesirable tungsten residues 11b and 34 discussed above remain since they are not removed by the EG-3 step, although the dielectric may be slightly undercut. Now, unlike the prior art, an etchant is used which etches the tungsten. The active agent is hydrogen peroxide in a basic solution. Ordinarily cleaning an interconnect interface with an oxidant would not be considered viable, but in this case the oxidized tungsten is largely put into solution, and an interconnect resistance problem is not created.

The active agent is kept at a low concentration and a temperature to control the etch rate of tungsten to an acceptable range. In one embodiment a temperature of 21–22° C. is used, although other temperatures may be selected with the right concentration of reactants. To further control the tungsten etch rate sonic energy is used. The use of sonic energy increases the tungsten etch rate such that turning the power off while the wafers are in the solution reduces the etch rate and minimizes unwanted etching during transport of the wafers.

The choice of the EG-HF step, peroxide concentration, temperature, sonic energy level, and process time allow one to optimize the process for residual tungsten defect removal, interconnect shape modification, metal step coverage, and the amount of, if any, sputter etch cleaning prior to metal deposition.

Looked at another way, the present invention prepares the surface including the exposed interconnect by subjecting it to oxidation at a slow enough rate that controlled amounts of tungsten may be removed while substantially removing detrimental material, with the net effect of improving device yields and electromigration performance.

The present invention may be formulated to also remove the underlying TiN adhesion layer from the dielectric surface. This formulation requires specific considerations to the nature of the adhesion layer used. However, for the embodiment of the present invention discussed below there is a minimal effect on the adhesion layer.

SPECIFIC STEPS USED IN ONE EMBODIMENT OF THE PRESENT INVENTION

Figure 4:
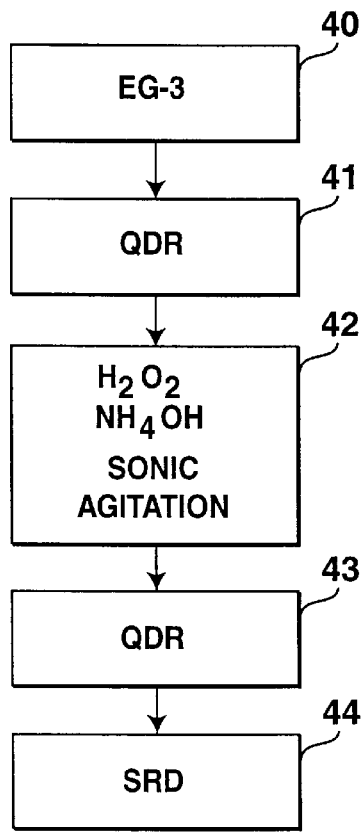
FIG. 4 is a series of steps used in one embodiment of the present invention.

After the tungsten layer shown in FIG. 3 has been etched back or otherwise planarized, the cleaning steps of FIG. 4 are used to clean the surface shown in FIG. 3. This cleaning removes the tungsten residue 11b. The cleaning steps below are generally performed on wafers which include a plurality of integrated circuits. Most often many wafers are simultaneously cleaned.

First as shown by step 40, the wafer is immersed in EG-3 to clean the exposed surface which includes the exposed portion of the interconnect 11a and the exposed surface of the dielectric layer 10 or layer 17. This solution comprises ethylene glycol and includes 0.1–1% HF, 2–5% $NH_4F$ and 4–8% water. This step does not remove any of the tungsten, however, it may remove some of the dielectric layer such as a BPSG layer. Following this, as shown by step 41, the wafer is subjected to a quick dip rinse (QDR) in water.

Then, as shown by step 42, the wafer or wafers are placed in a solution that includes hydrogen peroxide which chemically etches the tungsten. A solution in one embodiment of 38–40 liters of water, 2 liters of $NH_4OH$, and 2 liters of hydrogen peroxide is used. The solution is maintained at a temperature of approximately 21.5° C. (that is about room temperature). This solution is not strong enough at room temperature to rapidly etch the tungsten, without the addition of energy, particularly sonic energy. Sonic energy is added using a commercially available agitation device, for example a "Vertec Megasonic" at a power setting of 250 watts used for 215 seconds. In another example, a power setting of 125 watts is used for 160 seconds in another style of Vertec equipment. These settings will of course vary depending on the type of equipment used. The primary active agent in this solution is the hydrogen peroxide but to a lesser extent the $NH_4OH$ also is an active agent for attacking the tungsten.

Following step 42 the wafers are subjected to another QDR in water as shown by step 43. Then the wafers are dried in a spin dryer as shown by step 44.

Following the cleaning steps an overlying metal layer such as AlCu is deposited, masked and etched to form lines, including lines in contact with the interconnects. The underlying TiN layer when present, is etched with the etching of the AlCu, thus it remains only under the AlCu lines. The resultant structure will include interconnects such as shown in FIG. 6.

INTERCONNECT FABRICATED IN ACCORDANCE WITH THE PRESENT INVENTION

Figure 6:
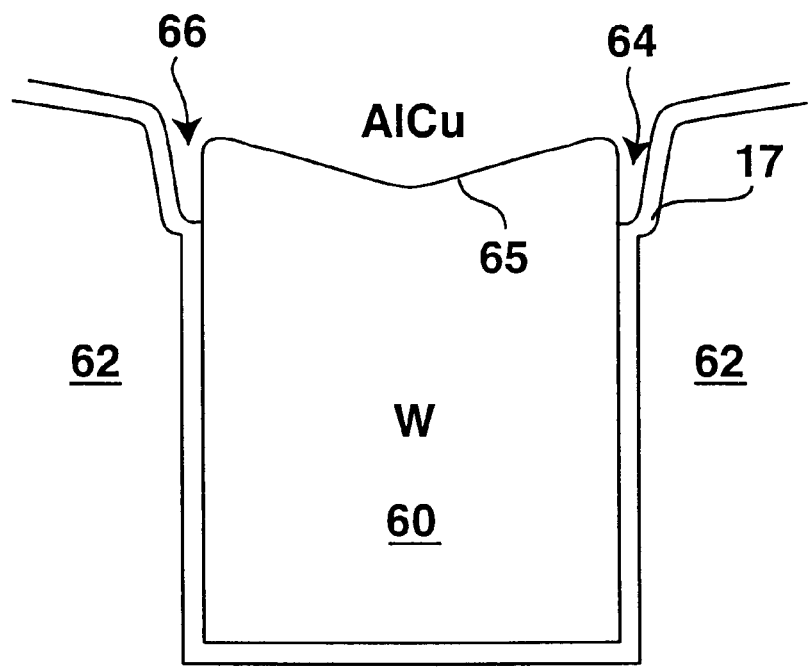
FIG. 6 is a cross sectional elevation view of an interconnect after processing in accordance with cleaning steps of the present invention.

The interconnect 60 of FIG. 6 is disposed through the dielectric layer 62 and is in contact with an overlying AlCu line. When the interconnect 60 and the exposed upper surface 65 of the layer 62 or adhesion layer are cleaned in accordance with the present invention as described in conjunction with FIG. 4, there is a substantial improvement in the electromigration performance associated with the AlCu line. First, as shown at 66, the sharper corner features of the interconnect surface are somewhat rounded, leading to a lower electric field associated with this area when compared to contour 54 of the interconnect of FIG. 5. (The general surface aside from the corner is not necessarily smoother for a successful application of the present invention.) Second, this geometry results in fewer or no voids such as void 53 of FIG. 5. Rather, there is a more well defined region 64 filled with the overlying AlCu layer. Elimination of the small voids allows an improvement in electromigration performance even with degraded metal step coverage conditions. Third, it has been found that surface 65 of the interconnect appears to be cleaner than the corresponding surface when cleaned with the prior art steps. (Cleaner meaning less trace chemical contamination and less physical residues.)

The overall improved performance with the cleaning steps shown of FIG. 4 include improved electromigraton performance and improved device yield. Moreover, the cleaning compared to the prior art is simplified because the argon sputtering step may be eliminated.

Thus, an improved cleaning has been described particularly suitable for cleaning tungsten plugs prior to the formation of the overlying metal layer. A mild tungsten etchant is used to clean the surface, better preparing it for contact with the overlying metal and at the same time removing some of the damaging tungsten residue which may remain from the tungsten etch back used to form the plug.

I claim:

1. In the fabrication of a semiconductor integrated circuit where tungsten is formed on a surface and in vias having openings at the surface, and where the tungsten is etched back to form tungsten plugs in the vias, a cleaning process for removing residue tungsten from the surface and for cleaning exposed tungsten plugs, comprising the steps of:

exposing the surface and the exposed tungsten plugs to a solution of hydrogen peroxide; and maintaining the solution at approximately room temperature while applying sonic energy to the solution, wherein the solution only minimally etches the tungsten without the application of the sonic energy to the solution.

2. The process defined by claim 1 wherein the surface comprises a layer of titanium nitride.

3. The process defined by claim 2 wherein prior to the exposure of the surface to the solution of hydrogen peroxide, the surface is exposed to a solution comprising ethylene glycol and HF.

* * * * *

UNITED STATES PATENT AND TRADEMARK OFFICE
CERTIFICATE OF CORRECTION

PATENT NO. : 5,904,560
DATED : May 18, 1999
INVENTOR(S) : Mark D. Brumley

It is certified that error appears in the above-identified patent and that said Letters Patent is hereby corrected as shown below:

In column 3 at line 10 delete "11 a" and insert -- 11a --

Signed and Sealed this

Fourth Day of January, 2000

Attest:

Attesting Officer

Acting Commissioner of Patents and Trademarks